United States Patent
Beha

(10) Patent No.: US 6,377,054 B1
(45) Date of Patent: Apr. 23, 2002

(54) TEST DEVICE FOR ELECTRICAL VOLTAGES WITH INTEGRATED ILLUMINATION UNIT

(75) Inventor: Christian Beha, Glottertal (DE)

(73) Assignee: Ch. Beha GmbH, Glottertal (DE)

( * ) Notice: Subject to any disclaimer, the term of this patent is extended or adjusted under 35 U.S.C. 154(b) by 0 days.

(21) Appl. No.: 09/357,635

(22) Filed: Jul. 20, 1999

(51) Int. Cl.[7] .................................................. G01R 31/02
(52) U.S. Cl. ........................................ 324/510; 324/556
(58) Field of Search ............................... 324/72.5, 754, 324/133, 149, 556, 395, 510

(56) References Cited

U.S. PATENT DOCUMENTS

| | | | |
|---|---|---|---|
| 4,006,409 A | * | 2/1977 | Adams ........................ 324/510 |
| 5,293,113 A | | 3/1994 | Beha et al. |
| 5,448,162 A | | 9/1995 | Beha |
| 5,672,964 A | * | 9/1997 | Vinci ........................ 324/72.5 |

* cited by examiner

*Primary Examiner*—Safet Metjahic
*Assistant Examiner*—Vincent Q. Nguyen
(74) *Attorney, Agent, or Firm*—Foley, Hoag & Eliot, LLP

(57) ABSTRACT

A test device is described for testing an electromagnetic quantity, such as a voltage or a magnetic field. The test device includes a housing, a sensor arranged in the housing and sensing the electromagnetic quantity, a processing circuit for processing to signals received from the sensor, display elements for displaying the signals processed by the processing unit, a galvanic element for supplying power to the test device, an illuminator for illuminating an area to be tested, and a switch for activating the illuminator. The test device has a small footprint and does not require an external light source even under difficult lighting conditions.

11 Claims, 4 Drawing Sheets

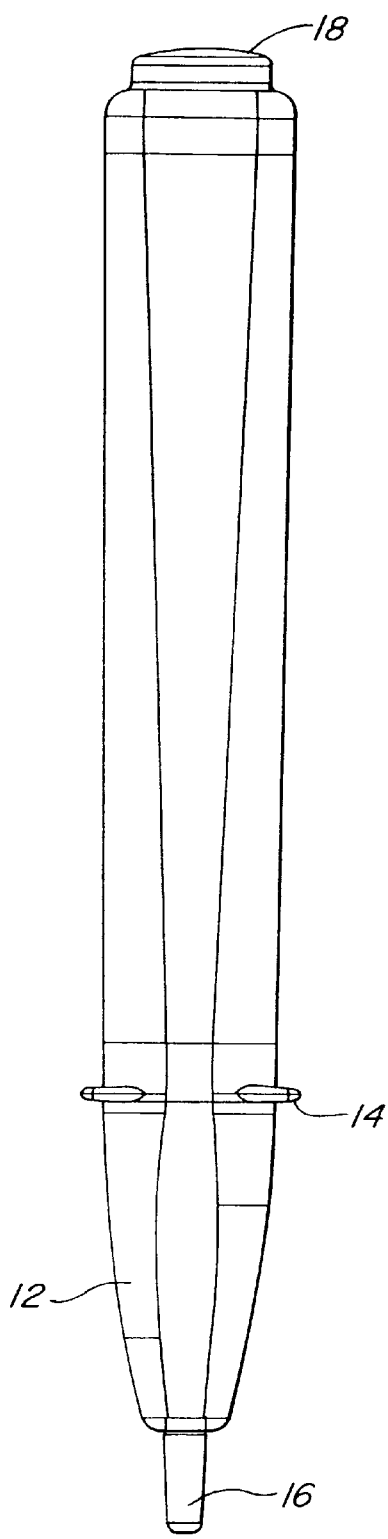
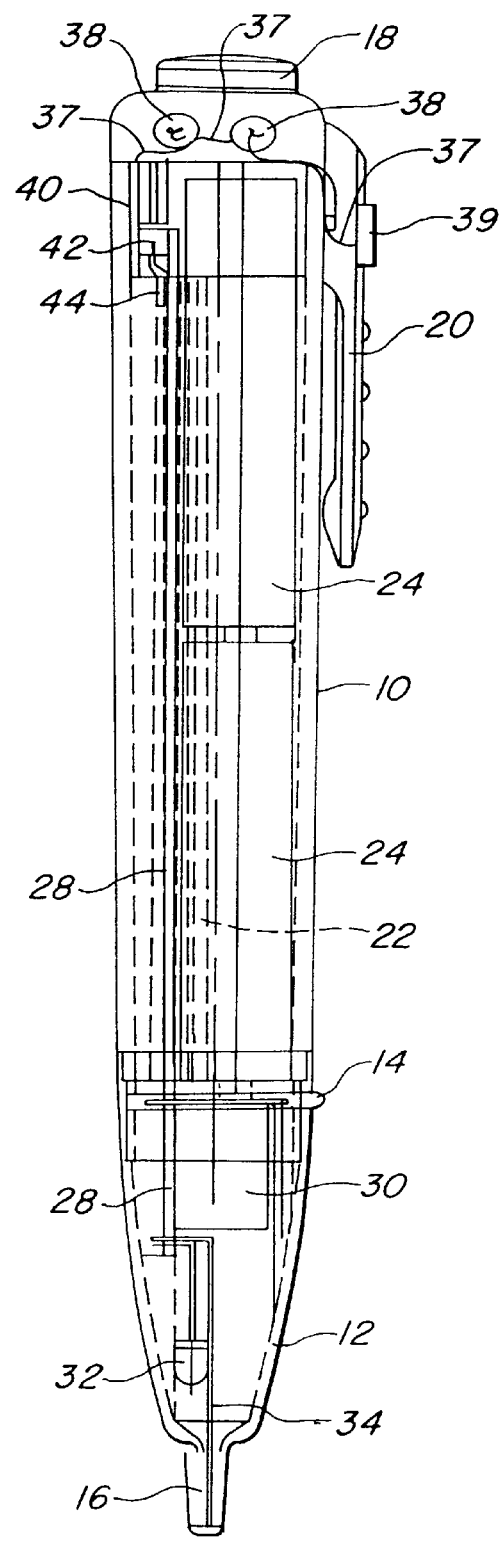
FIG. 3   FIG. 4

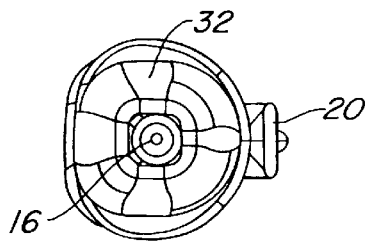
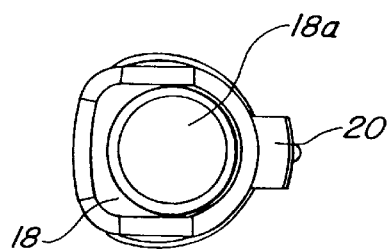
*FIG. 5*  *FIG. 6*
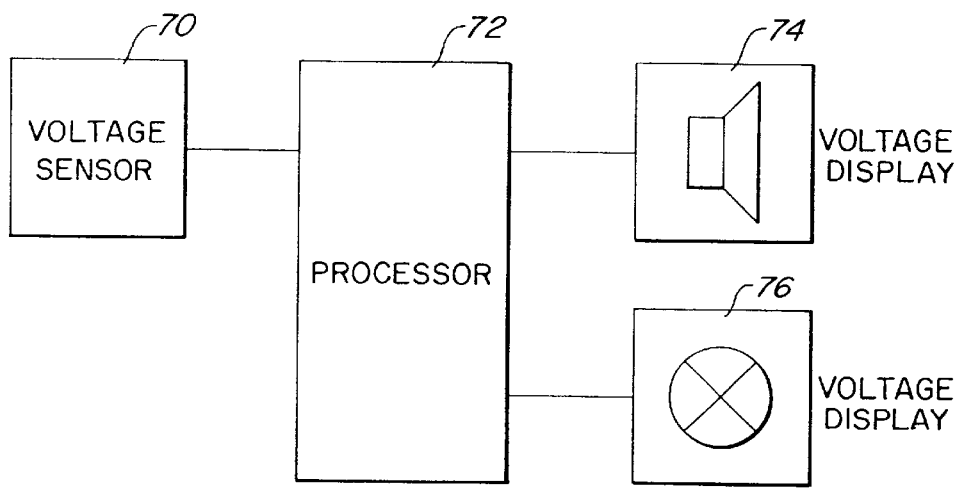
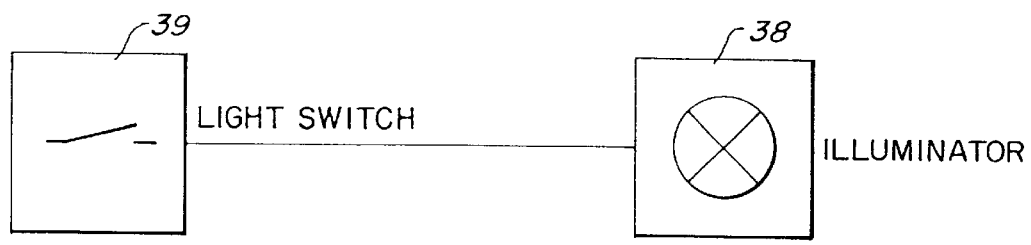
*FIG. 7*

TEST DEVICE FOR ELECTRICAL VOLTAGES WITH INTEGRATED ILLUMINATION UNIT

BACKGROUND OF THE INVENTION

1. Field of the Invention

This application relates to the field of electric test devices and more particularly to the field of electric test devices having an illumination unit.

2. Description of Related Art

Test devices for measuring electrical voltages are known in the art. Such devices are frequently pen-shaped, with an electrical circuit arranged inside a handle portion which can be held by an operator. A pin which is connected to the electrical circuit, extends away from the front end of the handle portion and can be brought into electrical contact with a wire to be tested. Examples of such voltage testers are described, for example, in the U.S. Pat. Nos. 5,293,113 and 5,448,162 commonly assigned to the Applicant.

Test devices are frequently used under poor viewing conditions, in particular when the wires to be tested are difficult to access. In particular under unfavorable lighting conditions, the operator may have difficulty finding the correct wire. To illuminate the area of interest, the operator may have to use a separate flashlight or a lamp connected with an extension cord which may be difficult to implement.

It is therefore desirable to provide a test device for electrical voltages which takes up little space and which does not require an external light source even under difficult lighting conditions.

SUMMARY OF THE INVENTION

According to an aspect of the invention, a test device for electrical voltages is integrated with an illumination device in a common housing which can be used both as a voltage sensor and as a flashlight. The test device further includes a processing circuit for processing the measured voltage signals, display elements for displaying these signals, and a galvanic element for supplying power to the device. With these features, the test device is simple, has a small footprint and can be easily carried. Moreover, the test device is adapted for testing electrical voltages under difficult lighting conditions and can also be used as a stand-alone flashlight.

The housing is preferably elongated and shaped like a pen. The housing may also be provided with a clip so that the test device can be easily carried, much like a writing utensil. With the elongated pen-shaped arrangement, the voltage sensor can be advantageously arranged in one end of the housing, while an illumination device is arranged in the other end of the housing, so that the sensor and the illumination device can be used independently. The elongated housing may also be adapted to receive cylindrical galvanic elements, for example, a primary galvanic cell or a rechargeable battery.

The processing circuit may be arranged on a narrow elongated printed circuit board to be received in the elongated pen-shaped housing. The elongated printed circuit board is preferably oriented parallel to the galvanic element(s) and may be inserted into a guide rail or channel provided in the housing.

The voltage sensor may be implemented as an electrically conducting pin or strip operating as an antenna, wherein the pin or strip terminates in a extended tip of the housing. With this arrangement, a voltage can be measured contactless with high sensitivity.

According to another advantageous embodiment, a magnetic sensor can be integrated into the housing. The magnetic sensor is preferably a Reed contact. A test device equipped with such a magnetic sensor can readily detect magnetic fields, thereby obviating the need for a separate test device.

The housing may be provided with a removable end cap to facilitate replacement of the galvanic element(s) and/or device maintenance and repair. The end cap may include a lamp of the illumination device. A plug connection between the end cap and the housing is provided with electrical contacts, thereby providing a reliable mechanical seat of the end cap on the housing as well as an electrically conducting connection between the lamp and a corresponding switch located in the housing of the test device.

The switch for switching the lamp power on and off can be implemented in several ways. For example, the switch may be a slide switch. The switch may also be a rotary switch and advantageously actuated by rotating the end cap relative to the housing. For example, the end cap may be rotated clockwise to turn the lamp on and rotated counterclockwise to turn the lamp off, or vice versa. The switch for activating the lamp function may also be a simple pushbutton switch or toggle switch disposed on the housing.

According to another advantageous embodiment, the switch can be in the form of a clip disposed on the housing. The test device can thereby be attached with the clip to, for example, a shirt pocket and the like. The clip may also operate as a switch.

Display elements for displaying the voltage are preferably light emitting diodes (LEDs), wherein the housing is transparent to light at least in the region of the LED's. The LED's and the light-transmissive region of the housing, respectively, can have different colors to make it easier to differentiate between displayed voltages and displayed magnetic fields.

In addition to the visual display, the housing may incorporate an acoustic indicator, for example, a buzzer.

Further features and advantages of the present invention will be apparent from the following description of preferred embodiments and from the claims.

BRIEF DESCRIPTION OF THE DRAWINGS

FIG. 3 is another side view of the test device of FIG. 2 rotated clockwise by 90°, FIG. 4 is another side view of the test device corresponding to FIG. 2 rotated clockwise by 180°, FIG. 5 is an axial view of the rear end of the test device, FIG. 6 is an axial view of the front end of the test device, and FIG. 7 is a schematic circuit diagram of the test device.

DETAILED DESCRIPTION OF PREFERRED EMBODIMENTS

Figure 1:
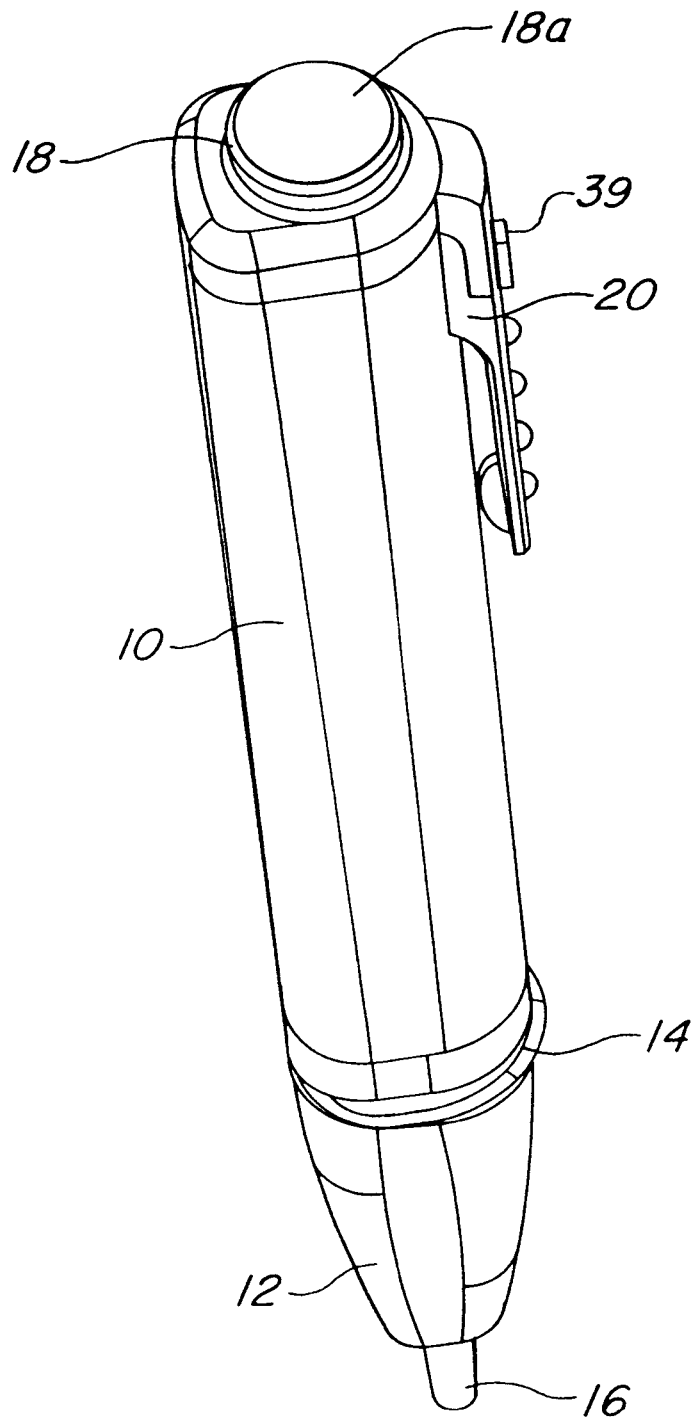
FIG. 1 is a perspective view of a test device.

The test device includes a housing 10 which has the form of a substantially cylindrical elongated pen. The housing may be made of an opaque plastic. The front end 12 of the housing 10 has a slight conical taper and is made visually distinct from the rest of the housing 10 by an interposed collar 14. The region of the front end 12 of the housing 10 may be made of an opaque plastic which maybe colored. The front end 12 terminates in an elongated tip 16 which may also be implemented as a screwdriver blade 90.

An end cap 18 is placed on the open rear end of the housing 10. The end cap 18 can also be made of an opaque plastic and may also be colored. The end cap 18 may be provided with an integrally formed clip 20 which is oriented parallel to the axis of the housing 10 and resiliently biased against the housing 10. Accordingly, the entire test device has the form of a writing utensil which can be carried in a shirt pocket and held, for example, by the clip 20.

The housing 10 has an essentially square cross-section with rounded corners. A side face of the square cross-section is formed as a convex semi circle. A plurality of ribs 22 extending in the longitudinal direction and projecting into the inside of the housing 10 are integrally formed with the side faces abutting the semi-circular side face. The ribs 22 in conjunction with the semi-circular side face of the housing 10 are adapted to receive two cylindrical galvanic elements 24 which are consecutively arranged in the axial direction. The galvanic elements 24 may be primary galvanic elements or rechargeable batteries.

Figure 2A:
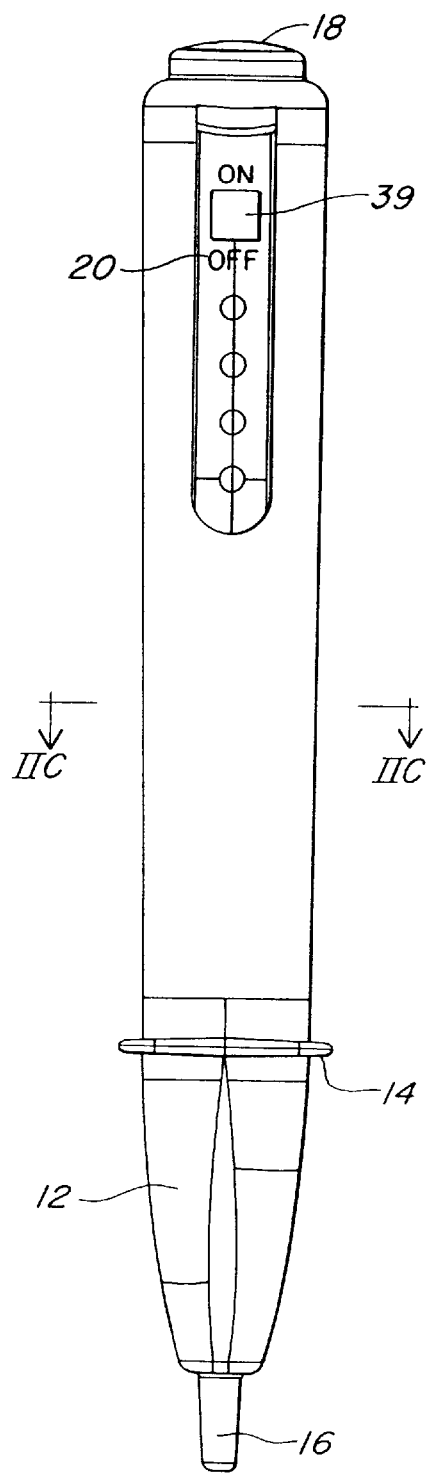
FIG. 2A is a side view of the test device.
Figure 2B:
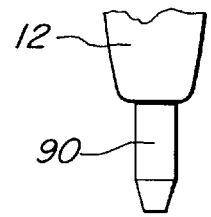
FIG. 2B shows in detail the tip of the test device.
Figure 2C:
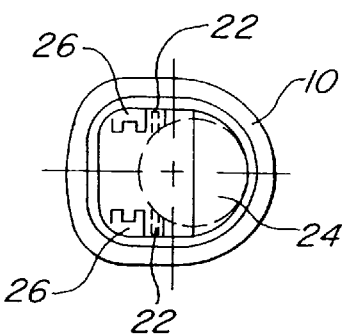
FIG. 2C is a cross-section of the test device of FIG. 2A taken along the line II—II.

Guide rails 26 projecting into the inside of the housing are integrally formed with the wall of the housing 10 between the ribs 22 and the side wall opposite the galvanic elements 24. The guide rails 26 have a U-shaped profile, with the open ends of the U-shaped guide rail profiles facing each other, as also seen in FIG. 2C. A narrow elongated printed circuit board 28 is inserted into the guide rails 26, with the printed circuit board 28 extending over the entire length of the cylindrical portion of the housing 10. The printed circuit board 28 includes a processing circuit which will be discussed below.

An acoustic indicator element 30, for example a buzzer, may be disposed on the rear end of the printed circuit board 28. In addition, an LED 32 may be disposed on the front end of the printed circuit board 28. An electrically conducting strip 34 operating as an antenna is soldered to the front end of the printed circuit board 28 and extends to the outwardly projecting tip 16.

Illumination means 38 in the form of one or several light bulbs, laser diodes, halogen lamps, LED's and the like are mounted in the end cap 18. These illumination means 38 are connected to the galvanic elements 24 with wires 37, wherein a switch 39 selectively connects and disconnects the wires. In the illustrated embodiment, the switch 39 is shown as a slide switch integrated with the clip 20.

To enhance the illumination provided by the lamp 38 installed under the end cap 18, an optical assembly 18a optimizing light scattering is integrated with the end cap, as illustrated in FIG. 6. In the illustrated example, the optical assembly may be a magnifying lens. The end cap 18 is advantageously optically transparent. The end cap 18 has a shoulder 40 with an integrally formed connector profile 42 which is provided with an electrical contact. The electrical contact can be used to electrically connect the lamp 38 to the galvanic elements 24 and to the switch 39. When the end cap 18 is placed on the housing 10, a connector contact 44 of the printed circuit board 28 is pushed into the connector profile 42. This provides a reliable mechanical connection between the end cap 18 and the housing 10 and at the same time, a reliable electrical connection between the processing circuit disposed on the printed circuit board 28 and the electrical elements in the end cap 18.

FIG. 7 shows schematically an electric circuit diagram of the test device. The voltage sensor 70 which includes the antenna-shaped strip 34, is connected to the processing circuit 72 disposed on the printed circuit board 28. The processing circuit 72 controls the acoustic indicator element 74 and a voltage display, for example, the LED 32 of FIG. 4 in accordance with the signals received from the voltage sensor 70.

The illumination means 38 can be switched on and off with the switch 39.

While the invention has been disclosed in connection with the preferred embodiment of a test device shown and described in detail, various modifications and improvements thereon will become readily apparent to those skilled in the art. Accordingly, the spirit and scope of the present invention is to be limited only by the following claims.

What is claimed is:

1. A test device for testing an electrical. voltage, comprising:
    a housing in the shape of a pen,
    a voltage sensor arranged in a first end section of the housing and providing a sensor signal in response to the electrical voltage,
    a processing circuit for processing the sensor signal,
    at least one display element for displaying a signal derived from the processed sensor signal,
    an illuminator arranged in a second end section of the housing located opposite the first end section,
    a galvanic assembly for supplying power to the test device, the galvanic assembly including at least one galvanic element disposed in the housing between the voltage sensor and the illuminator in an axial direction, with the processing circuit being arranged on an elongated printed circuit board adapted to be inserted in the housing along the axial direction parallel to the at least one galvanic element,
    two U-shaped guide rails, disposed inside the housing and receiving the printed circuit board, and
    a switch for activating the illuminator.

2. The test device according to claim 1, wherein the housing is made of plastic.

3. The test device according to claim 1, wherein the voltage sensor is an electrically conducting pin passing through a distended insulating tip of the housing.

4. The test device according to claim 1, wherein the display element comprises at least one LED disposed in a transparent section of the housing.

5. The test device according to claim 1, wherein the display element comprises an acoustic indicator element.

6. The test device according to claim 1, wherein the voltage sensor comprises a metallic test probe.

7. The test device according to claim 6, wherein the metallic test probe comprises a screwdriver blade.

8. The test device according to claim 1, wherein the second end section of the housing includes a removable end cap.

9. The test device according to claim 8, wherein the end cap is optically transparent and comprises an integrated optical assembly.

10. The test device according to claim 1, wherein the housing comprises a clip.

11. The test device according to claim 10, wherein the switch is integrated with the clip.

* * * * *